(12) United States Patent
Yim et al.

(10) Patent No.: US 9,190,401 B2
(45) Date of Patent: Nov. 17, 2015

(54) STACKED SEMICONDUCTOR PACKAGES

(71) Applicant: Samsung Electronics Co., Ltd., Suwon-Si, Gyeonggi-Do (KR)

(72) Inventors: Choong-Bin Yim, Cheonan-si (KR); Seung-Kon Mok, Suwon-si (KR); Jin-Woo Park, Seoul (KR); Dae-Young Choi, Yeosu-si (KR); Mi-Yeon Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/286,454

(22) Filed: May 23, 2014

(65) Prior Publication Data

US 2014/0256089 A1    Sep. 11, 2014

Related U.S. Application Data

(62) Division of application No. 13/029,736, filed on Feb. 17, 2011, now Pat. No. 8,759,959.

(30) Foreign Application Priority Data

Mar. 2, 2010    (KR) .......................... 10-2010-0018644

(51) Int. Cl.
*H01L 21/44* (2006.01)
*H01L 21/48* (2006.01)
(Continued)

(52) U.S. Cl.
CPC ................ *H01L 25/50* (2013.01); *H01L 24/73* (2013.01); *H01L 25/105* (2013.01); *H01L 2224/13025* (2013.01); *H01L 2224/16145* (2013.01); *H01L 2224/16225* (2013.01); *H01L 2224/17181* (2013.01); *H01L 2224/32145* (2013.01); *H01L 2224/32225* (2013.01); *H01L 2224/48227* (2013.01); *H01L 2224/73203* (2013.01); *H01L 2224/73204* (2013.01); *H01L 2224/73265* (2013.01); *H01L 2225/06513* (2013.01); *H01L 2225/06517* (2013.01); *H01L 2225/06565* (2013.01); *H01L 2225/1023* (2013.01);
(Continued)

(58) Field of Classification Search
CPC ...................................................... H01L 24/73
USPC .......... 257/686, 780, 774, E23.145, E23.011; 438/109, 667
See application file for complete search history.

(56) References Cited

U.S. PATENT DOCUMENTS

| 5,109,320 A | 4/1992 | Bourdelaise et al. |
| 5,346,861 A | 9/1994 | Khandros et al. |

(Continued)

FOREIGN PATENT DOCUMENTS

| KR | 20050027384 A | 3/2005 |
| KR | 100770934 B1 | 10/2007 |
| KR | 100842915 B1 | 6/2008 |

*Primary Examiner* — Nitin Parekh
(74) *Attorney, Agent, or Firm* — Harness, Dickey & Pierce, P.L.C.

(57) ABSTRACT

Semiconductor package includes a first semiconductor package including a first printed circuit board, and a first semiconductor device mounted on the first printed circuit board, and a second semiconductor package stacked on the first semiconductor package, and including a second printed circuit board and a second semiconductor device mounted on the second printed circuit board. The semiconductor package includes at least one first through electrode electrically connecting the second semiconductor package to the first printed circuit board through the first semiconductor device.

19 Claims, 14 Drawing Sheets

(51) Int. Cl.
*H01L 25/00* (2006.01)
*H01L 23/00* (2006.01)
*H01L 25/10* (2006.01)

(52) U.S. Cl.
CPC .............. *H01L2225/1058* (2013.01); *H01L 2924/01029* (2013.01); *H01L 2924/10253* (2013.01); *H01L 2924/15311* (2013.01); *H01L 2924/15331* (2013.01); *H01L 2924/18161* (2013.01)

(56) References Cited

U.S. PATENT DOCUMENTS

| | | |
|---|---|---|
| 5,656,547 A | 8/1997 | Richards et al. |
| 5,719,749 A | 2/1998 | Stopperan |
| 6,335,669 B1 | 1/2002 | Miyazaki et al. |
| 6,521,984 B2 | 2/2003 | Matsuura |
| 6,659,512 B1 | 12/2003 | Harper et al. |
| 6,717,251 B2 | 4/2004 | Matsuo et al. |
| 7,704,796 B2 | 4/2010 | Pagaila et al. |
| 7,855,442 B2 | 12/2010 | Magerlein et al. |
| 8,115,292 B2 * | 2/2012 | Toh et al. ............ 257/686 |
| 2003/0001287 A1 * | 1/2003 | Sathe ............ 257/780 |
| 2003/0013969 A1 | 1/2003 | Erikson et al. |
| 2008/0073771 A1 | 3/2008 | Seo et al. |
| 2008/0224306 A1 * | 9/2008 | Yang ............ 257/725 |
| 2010/0244208 A1 * | 9/2010 | Pagaila et al. ............ 257/659 |
| 2011/0024888 A1 | 2/2011 | Pagaila et al. |
| 2011/0037157 A1 | 2/2011 | Shin et al. |

* cited by examiner

STACKED SEMICONDUCTOR PACKAGES

CROSS-REFERENCE TO RELATED APPLICATION

This application is a divisional application of U.S. application Ser. No. 13/029,736, filed on Feb. 17, 2011 and claims priority under 35 U.S.C. §119 to Korean Patent Application No. 10-2010-0018644 filed on Mar. 2, 2010, in the Korean Intellectual Property Office. The entire contents of each of which are hereby incorporated herein by reference.

BACKGROUND

1. Field

Example embodiments of the inventive concepts relate to semiconductors, and more specifically, stacked semiconductor packages in which semiconductor packages are connected.

2. Description of Related Art

Currently, the electronic industry is rapidly developing, and users further demand light, compact and multifunctional electronic products. To meet such demand, an electronic product assembly technique has been developed, and in the technique, the same or different types of semiconductor packages are implemented as one module. Package-On-Package (PoP) technique may be a newly developed package technique to meet such demand.

In the PoP, the same or different types of a plurality of semiconductor packages are vertically stacked to reduce a horizontal mounting area, so that the integration density may be enhanced. Therefore, the PoP enables an electronic product to be compact in size, and thus the product may be employed to implement the PoP. As a result, a semiconductor package capable of enhancing structural and/or electrical characteristics is requested.

SUMMARY

Example embodiments of the inventive concepts relate to semiconductors, and more specifically, stacked semiconductor packages in which semiconductor packages are connected.

Example embodiments of the inventive concepts provide a stacked semiconductor package in which an area necessary for connecting upper and lower packages is reduced to improve structural and/or electrical characteristics.

Example embodiments of the inventive concepts also provide a method of fabricating a stacked semiconductor package.

In accordance with example embodiments of the inventive concepts, a semiconductor package includes upper and lower packages electrically connected to each other by a through electrode. The semiconductor package includes a first semiconductor package including a first printed circuit board, and a first semiconductor device mounted on the first printed circuit board; and a second semiconductor package stacked on the first semiconductor package. The second semiconductor package includes a second printed circuit board and a second semiconductor device mounted on the second printed circuit board. A first through electrode electrically connecting the second semiconductor package to the first printed circuit board through the first semiconductor device is provided.

In some example embodiments, the first semiconductor device may be formed between the second semiconductor package and the first printed circuit board, and may further include a first connection electrically connecting the first through electrode to the first printed circuit board.

In other example embodiments, the first semiconductor package may further include a first molding structure covering the first semiconductor device and the first printed circuit board.

In still other example embodiments, the first molding structure may entirely cover the first semiconductor device or expose at least one surface.

In yet other example embodiments, the first semiconductor package may further include a first through silicon via electrically connecting the second semiconductor package to the first printed circuit board through the first molding structure.

In yet other example embodiments, the second semiconductor package may include a second external connection electrically connected to the first semiconductor package on a surface facing the first semiconductor package.

In yet other example embodiments, the second external connection may be formed between the first through electrode or the first through silicon via and the second semiconductor package.

In yet other example embodiments, the semiconductor package may further include a second molding structure interposed between the first semiconductor package and the second semiconductor package and covering the second external connection.

In yet other example embodiments, the first semiconductor device may have a first surface facing the first printed circuit board and a second surface facing the second semiconductor package, and a re-distribution layer (RDL) may be formed on one of the first surface and the second surface.

In yet other example embodiments, the first semiconductor package may further include a bonding wire electrically connecting the first semiconductor device to the first printed circuit board.

In yet other example embodiments, the first or second semiconductor package may further include at least one third semiconductor device stacked on the first or second semiconductor device.

In yet other example embodiments, the first semiconductor device may be a logic chip, and the second semiconductor device may be a memory chip.

In yet other example embodiments, the first semiconductor package and the second semiconductor package may be individually fabricated to be stacked.

In yet other example embodiments, the second molding structure may be formed after stacking the first semiconductor package and the second semiconductor package.

In accordance with example embodiments of the inventive concepts, a semiconductor package having a through electrode includes a lower package, an upper substrate attached to the lower package and a plurality of conductive patterns formed between the lower package and the upper substrate. The lower package includes a lower substrate, a first semiconductor chip mounted on the lower substrate, and a plurality of first through electrodes electrically connected to the lower substrate through the first semiconductor chip. A second semiconductor chip is mounted on the upper substrate. The conductive patterns are connected to the first through electrodes, and all of the conductive patterns are arranged on the first semiconductor chip.

In some example embodiments, the width of the lower substrate may be smaller than a value in which 100 µm is added to the width of the first semiconductor chip. Further, the width of the lower substrate is substantially the same as that of the first semiconductor chip.

In other example embodiments, a plurality of external terminals formed on a surface of the lower substrate may be provided. The external terminals may be arranged to have a first pitch, and the conductive patterns may be arranged to have a second pitch different from the first pitch. The second pitch may be smaller than the first pitch.

In still other example embodiments, the external terminals may be formed of one selected from the group consisting of a solder ball, a conductive bump, a conductive spacer, a pin grid array (PGA), a lead grid array (LGA), an adhesive conductive film (ACF) and a combination thereof. The conductive patterns are formed of one selected from the group consisting of a solder ball, a conductive bump, a conductive spacer, a PGA, an LGA, an ACF and a combination thereof.

In yet other example embodiments, the second semiconductor chip may include at least one second through electrode. The upper substrate may have the same width as, or a greater width than, the lower substrate. The second semiconductor chip may be electrically connected to the upper substrate by one selected from the group consisting of a bonding wire, a beam lead, a conductive tape and a combination thereof.

In accordance with example embodiments of the inventive concepts, a semiconductor package is provided. The semiconductor package includes a lower package. The lower package includes a lower substrate, at least one first semiconductor chip adjacent to the lower substrate, a plurality of through electrodes penetrating the first semiconductor chip, and an interposer adjacent to the first semiconductor chip. An upper substrate is attached to the lower package. A second semiconductor chip is mounted on the upper substrate. A plurality of conductive patterns is formed between the lower package and the upper substrate. The interposer includes a plurality of front pads formed on a first surface and a plurality of back pads formed on a second surface facing the first surface and electrically connected to the front pads.

In some example embodiments, the interposer may be disposed between the first semiconductor chip and the lower substrate. The front pads may be arranged to have a first pitch corresponding to the through electrodes. The back pads may be arranged to have a second pitch different from the first pitch.

In other example embodiments, the interposer may be disposed between the first semiconductor chip and the upper substrate. The front pads may be arranged to have a first pitch corresponding to the conductive patterns. The back pads may be arranged to have a second pitch corresponding to the through electrodes.

In accordance with example embodiments, a method of fabricating a stacked semiconductor package includes mounting at least one first semiconductor device on a first printed circuit board to form a first semiconductor package, mounting at least one second semiconductor device on the second printed circuit board to form a second semiconductor package, stacking the second semiconductor package on the first semiconductor package, and forming a first through electrode that electrically connects the second semiconductor package to the first printed circuit board through the at least one first semiconductor device.

In example embodiments, a first connection is formed that electrically connects the first through electrode to the first printed circuit board. The at least one first semiconductor device may be between the second semiconductor package and the first printed circuit board.

The at least one first semiconductor device and the first printed circuit board may be partially covered with a first molding structure. At least one first conductive pattern may be formed that electrically connects the second semiconductor package to the first printed circuit board through the first molding structure.

At least one second external connection electrically connected to the first through electrode may be formed on a surface of the second semiconductor package facing the first semiconductor package. A second molding structure may be formed interposed between the first semiconductor package and the second semiconductor package so as to cover the second external connection.

In example embodiments, a re-distribution layer (RDL) may be formed on a first surface of the at least one first semiconductor device facing the first printed circuit board or a second surface of the at least one first semiconductor device facing the second semiconductor package.

According to other example embodiments, at least one connection land and a bond pad may be formed on the second surface. The RDL may be formed on the second surface, and may connect the at least one connection land to the bond pad. A bonding wire may be formed that electrically connects the bond pad to the first printed circuit board.

According to still other example embodiments, at least one connection pad and a RDL may be formed on a first surface. The RDL may connect the first through electrode to the at least one connection pad.

In example embodiments, at least one third semiconductor device may be stacked on the first semiconductor device. At least one second through electrode may be formed that electrically connects the second semiconductor package to the first semiconductor device through the at least one third semiconductor device.

In accordance with example embodiments, a method of fabricating a semiconductor package includes forming a lower package including a lower substrate, at least one first semiconductor chip mounted on the lower substrate, and a plurality of first through electrodes electrically connected to the lower substrate through the at least one first semiconductor chip, attaching an upper substrate to the lower package, mounting a second semiconductor chip on the upper substrate, and forming a plurality of conductive patterns between the lower package and the upper substrate such that all of the plurality of conductive patterns are positioned on the at least one first semiconductor chip, wherein the plurality of conductive patterns are connected to the plurality of first through electrodes.

According to example embodiments, the width of the lower substrate may be formed smaller than 100 μm more than a width of the at least one first semiconductor chip. The width of the lower substrate may be formed substantially the same as that of the at least one first semiconductor chip. The plurality of conductive patterns are formed of one selected from the group consisting of a solder ball, a conductive bump, a conductive spacer, a pin grid array (PGA), a lead grid array (LGA), an adhesive conductive film (ACF) and a combination thereof.

According to example embodiments, a plurality of external terminals may be formed on a surface of the lower substrate. The plurality of external terminals may have a first pitch, and the plurality of conductive patterns may have a second pitch different from the first pitch. The second pitch may be smaller than the first pitch. The plurality of external terminals may be formed of one selected from the group consisting of a solder ball, a conductive bump, a conductive spacer, a PGA, an LGA, an ACF and a combination thereof.

In accordance with example embodiments, a method of fabricating a semiconductor package includes forming a lower package including a lower substrate, at least one first semiconductor chip adjacent to the lower substrate, a plurality of through electrodes penetrating the at least one first semiconductor chip, and an interposer adjacent to the first semiconductor chip, attaching an upper substrate to the lower package, mounting a second semiconductor chip on the upper substrate, and forming a plurality of conductive patterns between the lower package and the upper substrate. The interposer may include a plurality of front pads on a first surface, and a plurality of back pads formed on a second surface facing the first surface and electrically connected to the front pads.

According to example embodiments, the interposer may be formed between the at least one first semiconductor chip and the lower substrate. The front pads may have a first pitch corresponding to the plurality of through electrodes, and the plurality of back pads may have a second pitch different from the first pitch.

According to other example embodiments, the interposer may be formed between the at least one first semiconductor chip and the upper substrate. The front pads may have a first pitch corresponding to the plurality of conductive patterns, and the plurality of back pads may have a second pitch corresponding to the plurality of through electrodes.

BRIEF DESCRIPTION OF THE DRAWINGS

Example embodiments will be more clearly understood from the following detailed description taken in conjunction with the accompanying drawings. FIGS. 1-21 represent non-limiting, example embodiments as described herein.

FIG. 1 is a cross-sectional view of a semiconductor package according to a example embodiments of the inventive concepts;

FIG. 2 is an enlarged view of a portion K of FIG. 1;

FIG. 3 is a side view of a semiconductor device illustrated in FIG. 1;

FIG. 4 is a plan view of a part of a semiconductor package according to a example embodiments of the inventive concepts;

FIGS. 5 to 7 are cross-sectional views of a stacked semiconductor package in which a molding structure is formed according to example embodiments of the inventive concepts;

FIGS. 9 and 10 are cross-sectional views of a stacked semiconductor package in which a through silicon via is formed according to example embodiments of the inventive concepts;

FIGS. 11 and 12 are cross-sectional views of a stacked semiconductor package in which a molding structure is formed between stacked packages according to example embodiments of the inventive concepts;

FIGS. 13 to 15 are cross-sectional views of a stacked semiconductor package in which a bonding wire is formed according to example embodiments of the inventive concepts;

FIGS. 16 to 18 are cross-sectional views illustrating a method of fabricating a stacked semiconductor package according to example embodiments of the inventive concepts;

FIG. 19 is a cross-sectional view of a stacked semiconductor package according to example embodiments of the inventive concepts;

FIG. 20 is a perspective view of an electronic device according to example embodiments of the inventive concepts; and FIG. 21 is a system block diagram of an electronic device according to example embodiments of the inventive concepts.

DETAILED DESCRIPTION OF THE EMBODIMENTS

Figure 1:
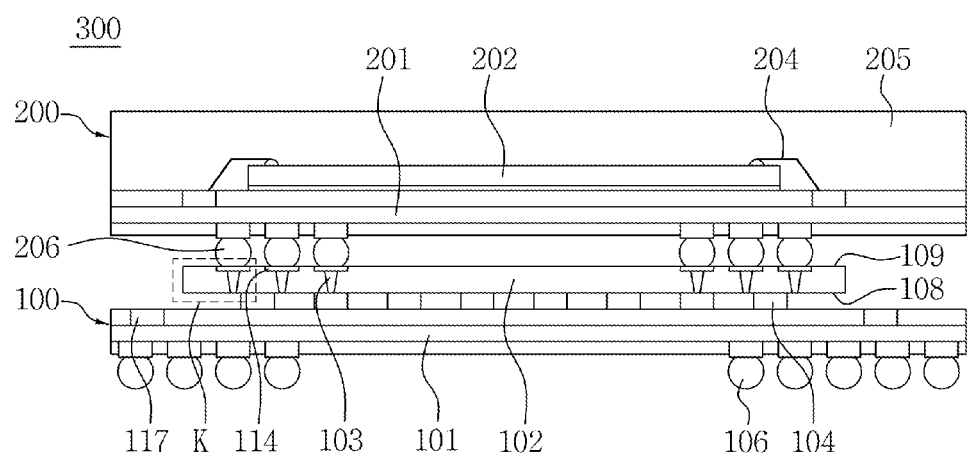

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments will be more clearly understood from the following detailed description taken in conjunction with the accompanying drawings. FIGS. 1-4 represent non-limiting, example embodiments as described herein.

Figure 2:
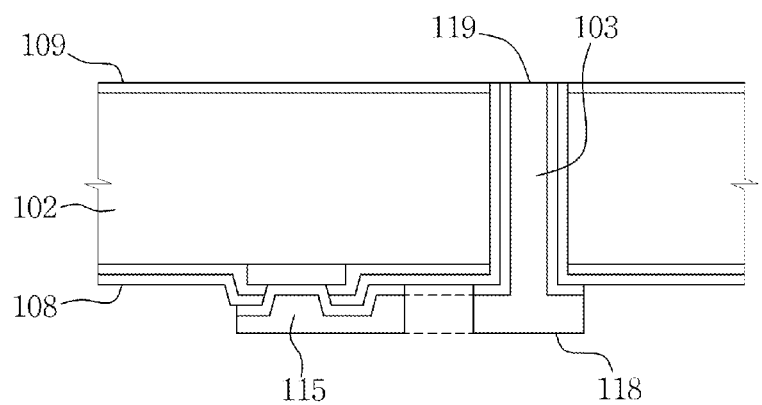
Figure 3:
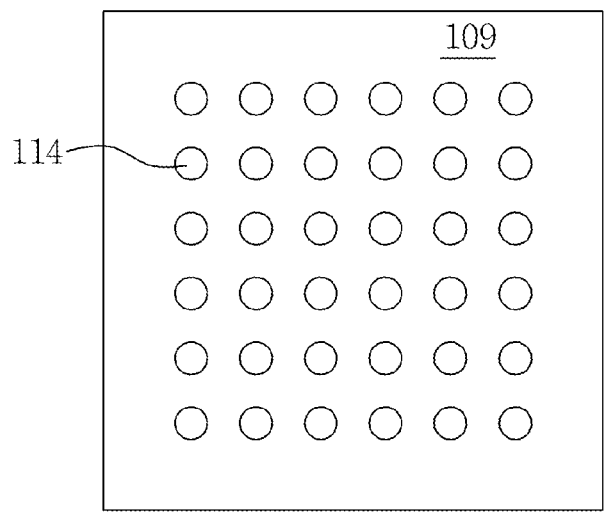

FIGS. 1 to 3 illustrate a semiconductor package according to example embodiments of the inventive concepts. FIG. 1 is a cross-sectional view of a semiconductor package according to example embodiments of the inventive concepts. FIG. 2 is an enlarged view of a portion K of FIG. 1, and FIG. 3 is a side view of the semiconductor device.

Referring to FIGS. 1 and 2, a stacked semiconductor package 300 according to example embodiments of the inventive concepts includes a first semiconductor package 100 and a second semiconductor package 200 stacked on the first semiconductor package 100. The first semiconductor package 100 includes a first printed circuit board 101 and a first semiconductor device 102 mounted on a surface of the first printed circuit board 101. The first printed circuit board 101 includes an interconnection pattern 117 formed inside or outside of the first printed circuit board 101. When the first semiconductor device 102 is a semiconductor chip, the first printed circuit board 101 may be a package substrate, and when the first semiconductor device 102 is a chip scale package (CSP), the first printed circuit board 101 may be a substrate for mounting a package.

In example embodiments of the inventive concepts, the first printed circuit board 101 may be one selected from the group consisting of a rigid printed circuit board, a flexible printed circuit board and a combination thereof.

The first semiconductor device 102 has a first surface 108 facing the first board, a second surface 109 that faces the second semiconductor package 200 and is the opposite side of the first surface, and a first through electrode 103 formed through the first semiconductor device 102 between the first surface 108 and the second surface 109. The location of the first through electrode 103 may be determined depending on a design of an integrated circuit (not shown) formed in the first semiconductor device 102. When the integrated circuit is formed in the center of the first semiconductor device 102, the first through electrode 103 may be formed at an edge of the first semiconductor device 102, or it may be formed in the center region of the first semiconductor device 102, in which the integrated circuit (not shown) is not formed. The second semiconductor package 200 may be electrically connected to the first semiconductor package 100 through the first through electrode 103. The first through electrode 103 may be formed at a wafer lever during or after a process of forming the first semiconductor device 102.

The first semiconductor device 102 may be electrically connected to the first printed circuit board 101 in a wire bonding or flip chip manner. When they are connected in the flip chip manner, as shown in FIGS. 1 and 2, the first semiconductor device 102 may further include a flip chip connection pad 115 and a first connection 104 connected to the flip chip connection pad 115 on the first surface 108 of the first semiconductor device 102. The first connection 104 may be a solder bump, a solder ball, etc. The first connection 104 electrically connects the flip chip connection pad 115 formed on the first semiconductor device 102 to the interconnection pattern 117 formed on the first printed circuit board 101. Also, the first connection 104 may be formed between the interconnection pattern 117 and the first through electrode 103. In this case, the first connection 104 may be in contact with a surface 118 of the first through electrode 103.

The first printed circuit board 101 may further include a first external connection 106 on an opposite surface of the surface on which the first semiconductor device 102 is mounted, and may be mounted on a module substrate (not shown) through the first external connection 106. When the first semiconductor device 102 is a chip scale package, it may be directly mounted on the module substrate through the first connection 104. In some example embodiments of the inventive concepts, the first external connection 106 may be a plurality of external terminals. The external terminals may be one selected from the group consisting of a solder ball, a conductive bump, a conductive spacer, a pin grid array (PGA), a lead grid array (LGA), an adhesive conductive film (ACF) and a combination thereof.

The second semiconductor package 200 includes a second printed circuit board 201, and a second semiconductor device 202 mounted on the second printed circuit board 201. The second semiconductor device 202 may be electrically connected to the second printed circuit board 201 through a second connection 204 in a wire bonding or flip chip manner. The second semiconductor package 200 may further include a second molding structure 205 covering at least a surface of the second semiconductor device 202. The molding structure may be formed of an epoxy molding compound (EMC). The second printed circuit board 201 may further include a second external connection 206 on an opposite surface of the surface on which the second semiconductor device 202 is mounted, and may be electrically connected to the first semiconductor package 100 through the second external connection 206.

In some example embodiments of the inventive concepts, the second external connection 206 may be a plurality of conductive patterns. The conductive patterns may be formed of one selected from the group consisting of a solder ball, a conductive bump, a conductive spacer, a PGA, an LGA, an ACF and a combination thereof. The second external connection 206 may be electrically connected to the first printed circuit board 101 through the first through electrode 103.

Referring to FIG. 3, at least one connection land 114 may be formed on the second surface 109 of the first semiconductor device 102, and the second external connection 206 may be connected to the connection land 114. The connection land 114 may be formed on the first through electrode 103, and may be a surface 119 exposed on the second surface 109 of the first semiconductor device 102 of the first through electrode 103.

Figure 4:
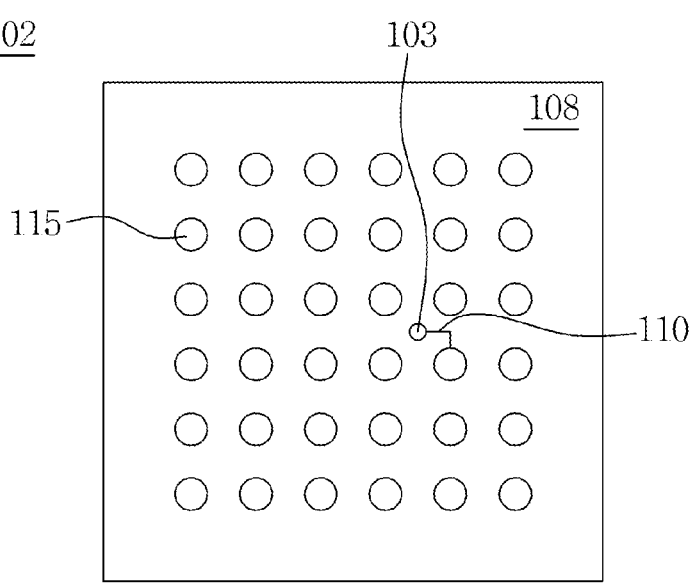

FIG. 4 is a plan view of a part of a semiconductor package according to example embodiments of the inventive concepts.

Referring to FIG. 4, in a stacked semiconductor package 300 according to example embodiments of the inventive concepts, the connection land 114 and the flip chip connection pad 115 may be formed in a region where the first through electrode 103 of the first semiconductor device 102 is not formed. In this case, a first re-distribution layer 110 electrically connecting the flip chip connection pad 115 or the connection land 114 to the first through electrode 103 may be formed on the first surface 108 or the second surface (109 of FIG. 1) of the first semiconductor device 102. The first re-distribution layer 110 may be formed using an internal interconnection (not shown) during forming the first semiconductor device 102 or using an additional process (e.g., an inkjet printing) after forming the first semiconductor device 102.

Figure 5:
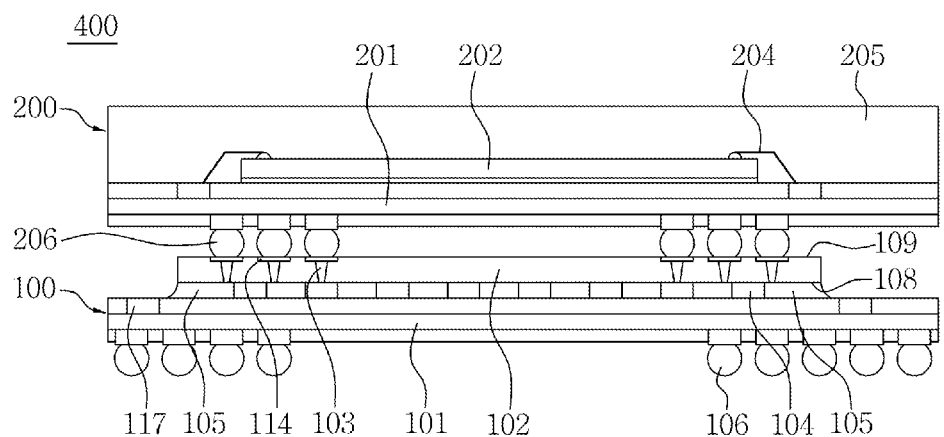
Figure 6:
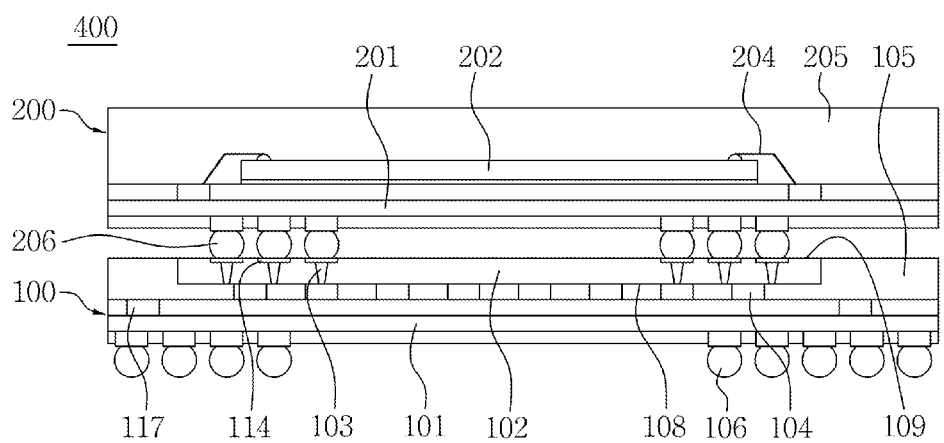
Figure 7:
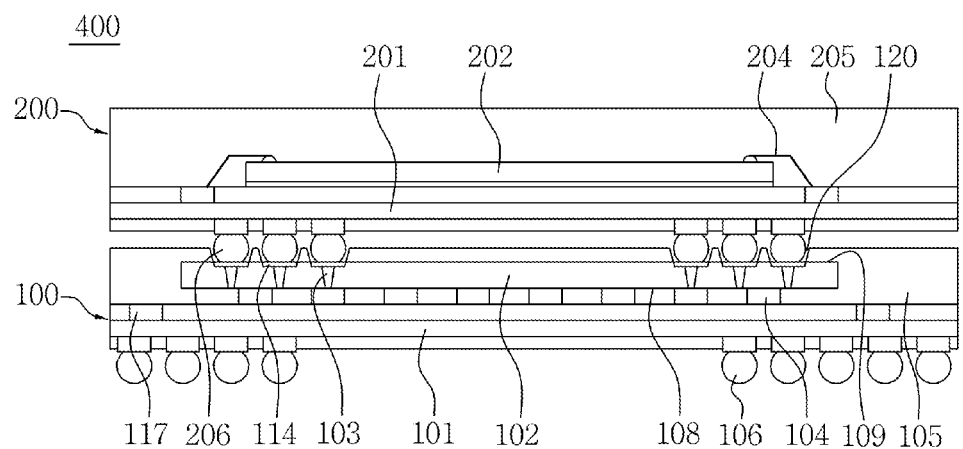

FIGS. 5 to 7 are cross-sectional views of a semiconductor package according to example embodiments of the inventive concepts.

Referring to FIG. 5, in a stacked semiconductor package 400 according to example embodiments of the inventive concepts, the first semiconductor package 100 further includes a first molding structure 105 covering at least one surface of the first semiconductor device 102. When the first semiconductor device 102 is connected in a wire bonding manner, the first molding structure 105 may entirely cover the wire (not shown). When the device 102 is connected in a flip chip manner as illustrated in FIG. 5, the first molding structure 105 is formed as an underfill to entirely cover the first connection 104.

Referring to FIG. 6, the first molding structure 105 may be formed on the same level as, and/or lower than, the second surface 109 of the first semiconductor device 102 to expose the second surface 109.

Referring to FIG. 7, even though the first molding structure 105 covers the second surface 109 of the first semiconductor device 102, an opening 120 may be formed to expose the connection land 114 or the surface 118 of the first through electrode 103. As a result, the second semiconductor package 200 may be connected to the first through electrode 103 through the opening 120. The opening 120 may be formed using a mold at the same time when the first molding structure 105 is formed or using laser drilling or etching after forming the first molding structure 105.

Figure 8A:
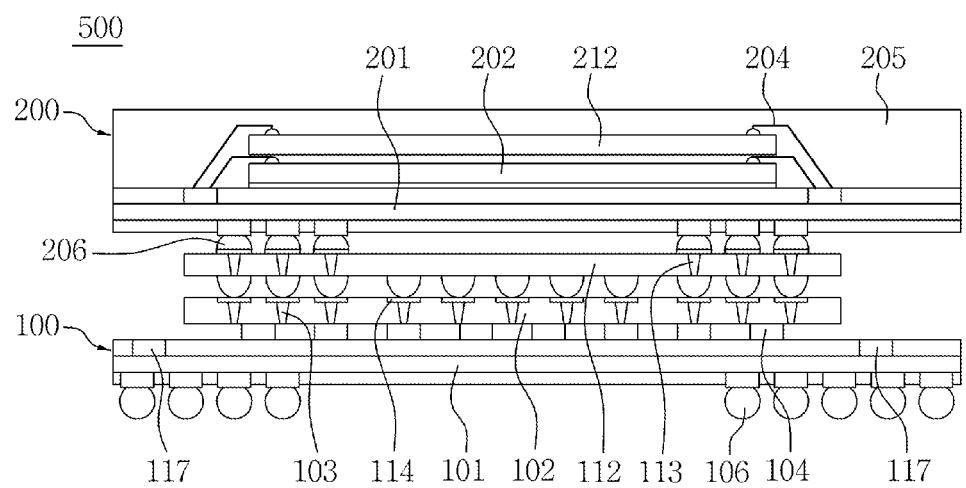
FIGS. 8A, 8B and 8C are a cross-sectional view of a stacked semiconductor package in which a stacked chip is formed according to example embodiments of the inventive concepts.
Figure 8B:
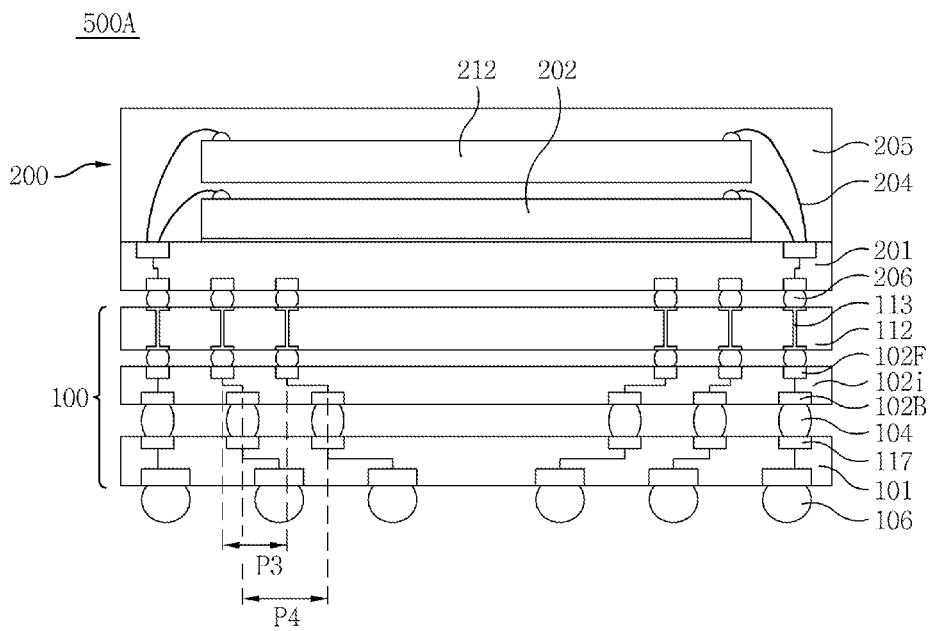
Figure 8C:
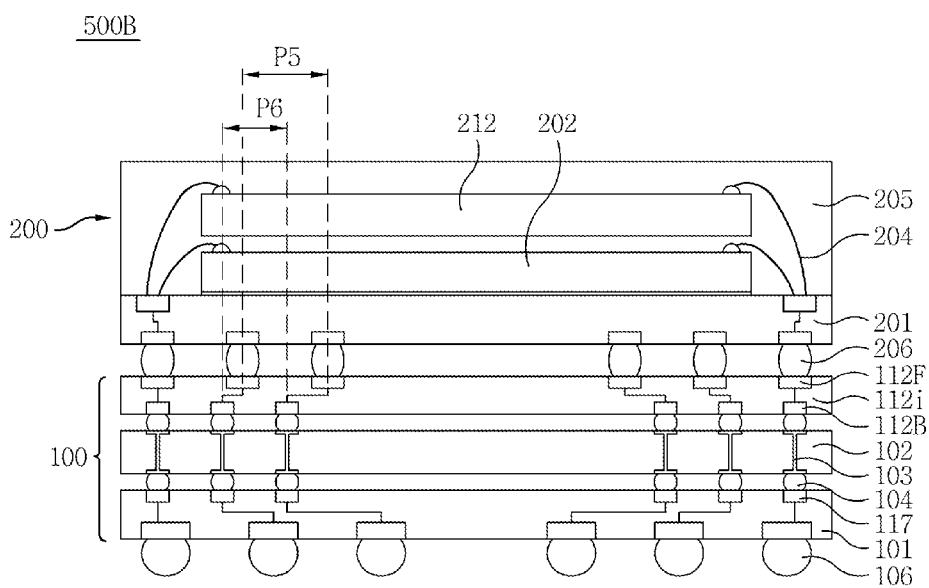

FIGS. 8A, 8B and 8C are a cross-sectional view of a semiconductor package according to example embodiments of the inventive concepts.

Referring to FIG. 8A, in a stacked semiconductor package 500 according to example embodiments of the inventive concepts, the first semiconductor package 100 further includes a third semiconductor device 112 stacked on the first semiconductor device 102. The third semiconductor device 112 may have a second through electrode 113 formed through the third semiconductor device 112, and the second semiconductor package 200 may be electrically connected to the first semiconductor package 100 through the second through electrode 113. Connecting the second semiconductor package 200 to the first semiconductor package 100 through the second through electrode 113 may be similar to connecting the second semiconductor package 200 to the first semiconductor package 100 through the first through electrode 103. When the third semiconductor device 112 is stacked between the first semiconductor device 102 and the first printed circuit board 101, the third semiconductor device 112 may not include the second through electrode 113. In this case, the third semiconductor device 112 may further include an interconnection electrically connected to the first through electrode 103 on a surface facing the first semiconductor device 102. The first semiconductor device 102 may be the same type of a semiconductor device as, or a different type of a semiconductor device from, the third semiconductor device 112, and at least one of them may be a logic device. For example, the first semiconductor device 102 may be a logic chip.

The second semiconductor package 200 may be formed by stacking a plurality of second semiconductor devices 202 and 212. The plurality of second semiconductor devices 202 and 212 may be electrically connected to the second printed circuit board 201 in a wire bonding manner or a flip chip manner, and the plurality of second semiconductor devices 202 and 212 may be connected to each other in the same manner or in different manners. When the plurality of second semiconductor devices 202 and 212 are connected in the wire bonding manner, a second molding structure 205 may be further formed to protect a bonding wire. The plurality of second semiconductor devices 202 and 212 may be the same type, or different types, of semiconductor devices, and at least one of them may be a memory device. For example, the second semiconductor devices 202 and 212 may be a memory chip.

Referring to FIG. 8B, a stacked semiconductor package 500A according to example embodiments of the inventive concepts may include the first semiconductor package 100 and the second semiconductor package 200. The second external connection 206 (e.g., a plurality of conductive patterns) may be provided between the first semiconductor package 100 and the second semiconductor package 200. The first semiconductor package 100 may include the first printed circuit board 101, an interposer 102i and the third semiconductor device 112.

The interposer 102i may be interposed between the first printed circuit board 101 and the third semiconductor device 112. The interposer 102i may include one selected from the group consisting of a glass plate, a semiconductor substrate (e.g., a silicon wafer), a printed circuit board and a combination thereof. A plurality of front pads 102F may be disposed on a first surface of the interposer 102i. A plurality of back pads 102B may be disposed on a second surface of the interposer 102i. The first surface may face the second surface. Each of the front pads 102F may be electrically connected to the corresponding one of the back pads 102B.

Each of the front pads 102F may be electrically connected to the corresponding one of the second through electrodes 113 penetrating the third semiconductor device 112. In this case, the front pads 102F may be arranged to have a first pitch P3 corresponding to the second through electrodes 113. Each of the back pads 102B may be electrically connected to the corresponding one of the interconnection patterns 117 via the first connection 104. In this case, the back pads 102B may be arranged to have a second pitch P4 different from the first pitch P3. The first pitch P3 may be smaller than the second pitch P4.

In example embodiments, the first pitch P3 may be equal to, or greater than, the second pitch P4.

Referring to FIG. 8C, a stacked semiconductor package 500B according to example embodiments of the inventive concepts may include the first semiconductor package 100 and the second semiconductor package 200. The second external connection 206 (e.g., a plurality of conductive patterns) may be provided between the first semiconductor package 100 and the second semiconductor package 200. The first semiconductor package 100 may include the first printed circuit board 101, the first semiconductor device 102 and an interposer 112i.

The interposer 112i may be interposed between the first semiconductor device 102 and the second printed circuit board 201. A plurality of front pads 112F may be disposed on a first surface of the interposer 112i. A plurality of back pads 112B may be disposed on a second surface of the interposer 112i. The first surface may face the second surface. Each of the front pads 112F may be electrically connected to the corresponding one of the back pads 112B.

Each of the front pads 112F may be electrically connected to the second printed circuit board 201 via the second external connection 206. In this case, the front pads 112F may be arranged to have a third pitch P5 corresponding to the second external connection 206. Each of the back pads 112B may be electrically connected to the corresponding one of the first through electrodes 103 penetrating the first semiconductor device 102. In this case, the back pads 112B may be arranged to have a fourth pitch P6 different from the third pitch P5. The third pitch P5 may be greater than the fourth pitch P6.

In some embodiments, the third pitch P5 may be equal to, or smaller than, the fourth pitch P6.

Figure 9:
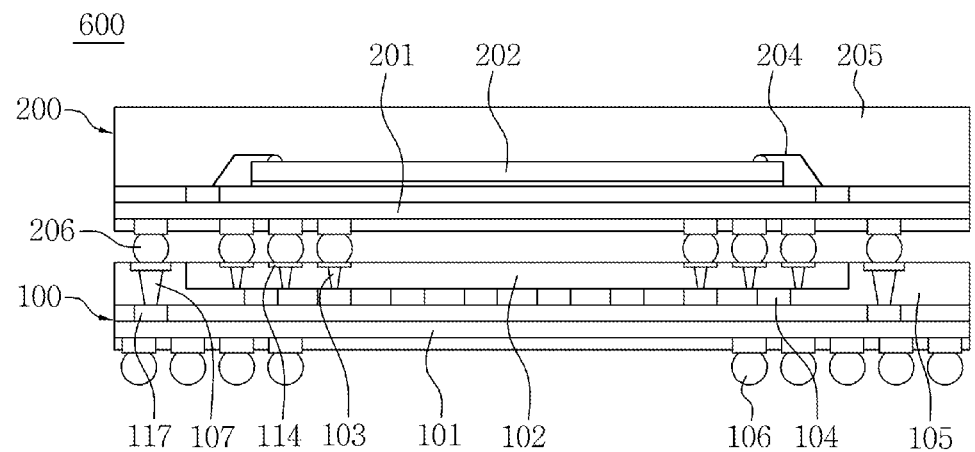

FIG. 9 is a cross-sectional view of a semiconductor package according to example embodiments of the inventive concepts.

Referring FIG. 9, in a stacked semiconductor package 600 according to example embodiments of the inventive concepts, the first semiconductor package 100 further includes a first through silicon via 107 formed through the first molding structure 105. The second semiconductor package 200 may be electrically connected to the first semiconductor package 100 through the first through silicon via 107. The first through silicon via 107 may be exposed on a surface of the first molding structure 105 from the interconnection pattern 117 formed on the first printed circuit board 101 through the first molding structure 105. The first through silicon via 107 may be formed by forming a through hole (not shown) at the same time when the first molding structure 105 is formed using a mold, or after the first molding structure 105 is formed, using laser drilling or etching, and filling the through hole with a conductive material (e.g., a metal or polysilicon). Alternatively, the first through silicon via 107 may be formed by forming a conductive bar (not shown) on the first printed circuit board 101 and forming the first molding structure 105. In this case, the second external connection 206 may be interposed between the first through silicon via 107 and the second semiconductor package 200 to electrically connect the second semiconductor package 200 to the first through silicon via 107.

Figure 10:
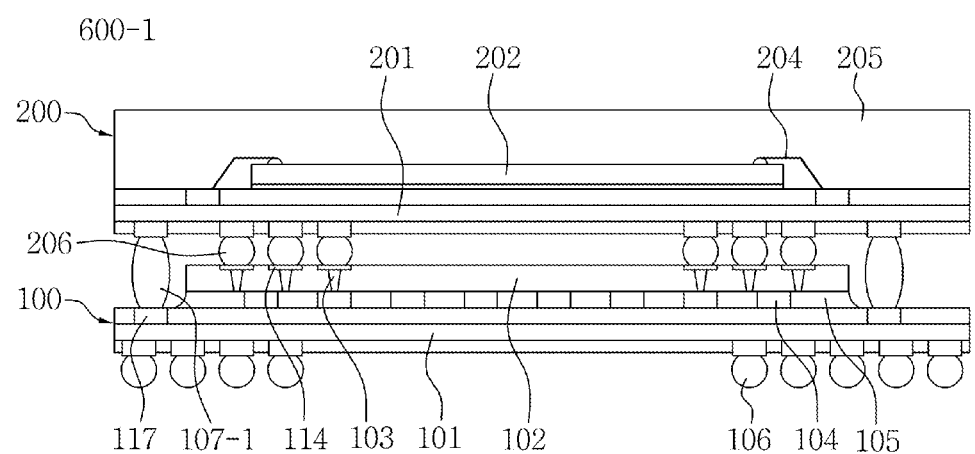

FIG. 10 is a modified embodiment of FIG. 9.

Referring to FIG. 10, in a stacked semiconductor package 600-1 according to example embodiments of the inventive concepts, the first semiconductor package 100 may be electrically connected to the second semiconductor package 200 using a solder ball 107-1. Here, the height of the solder ball 107-1 may be higher than that of the second external connection 206, or the solder ball may be formed by stacking (not shown) a plurality of solder balls or a plurality of bumps. The electrical connection between the first semiconductor package 100 and the second semiconductor package 200 may not be limited to example embodiments of the inventive concepts. When the first printed circuit board 101 and/or the second printed circuit board 201 are formed of a rigid printed circuit board, the first printed circuit board 101 and/or the second printed circuit board 201 may be formed to be upwardly or downwardly bent.

Figure 11:
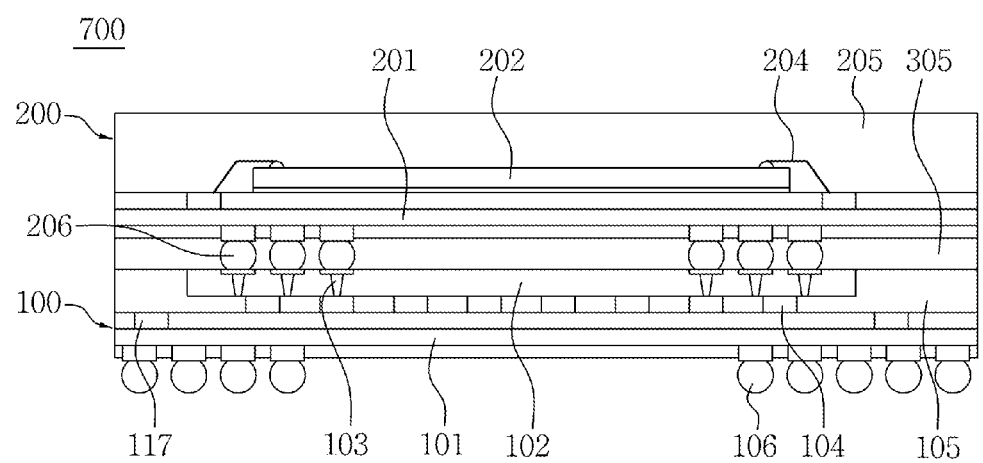
Figure 12:
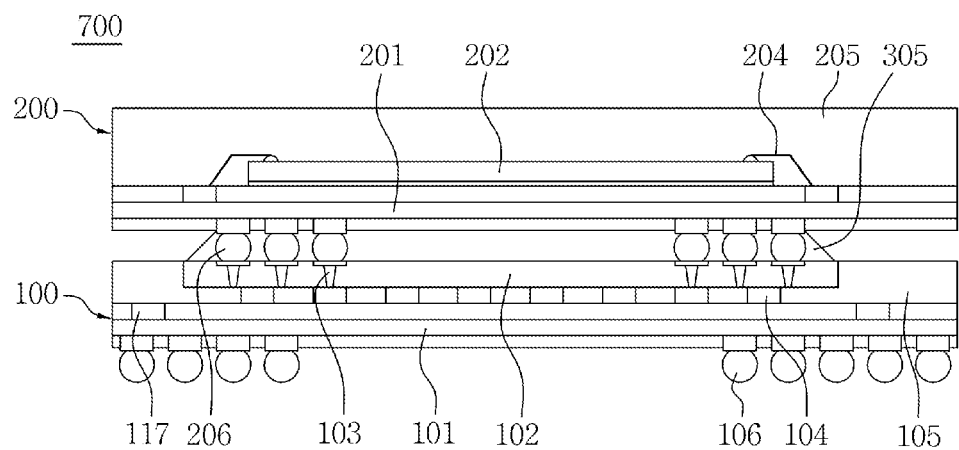

FIGS. 11 and 12 are cross-sectional views of a semiconductor package according to example embodiments of the inventive concepts.

Referring to FIG. 11, a stacked semiconductor package 700 according to example embodiments of the inventive concepts further includes a third molding structure 305 interposed between the first semiconductor package 100 and the second semiconductor package 200. The third molding structure 305 may cover the second external connection 206 and fill a gap between the first semiconductor package 100 and the second semiconductor package 200. Here, a side of the third molding structure 305 may be aligned with a side of the first molding structure 105 and/or the second molding structure 205.

The third molding structure 305 may be formed by filling the gap between the first semiconductor package 100 and the second semiconductor package 200 after stacking the first semiconductor package 100 and the second semiconductor package 200, or may be formed at the same time when the first molding structure 105 and the second molding structure 205 are formed.

When the first semiconductor package 100 and the second semiconductor package 200 have a package-in-package structure, the second semiconductor package 200 may be stacked on the first semiconductor device 102, and a molding structure that simultaneously covers the first semiconductor package 100 and the second semiconductor package 200 may be formed. In this case, the first semiconductor package 100 may be greater than the second semiconductor package 200, and the first semiconductor device 102 and the second semiconductor device 202 may be stacked to face each other.

Referring to FIG. 12, the third molding structure 305 may be formed to partially fill the gap between the first semiconductor package 100 and the second semiconductor package 200. Here, the third molding structure 305 may cover the second external connection 206.

Figure 13:
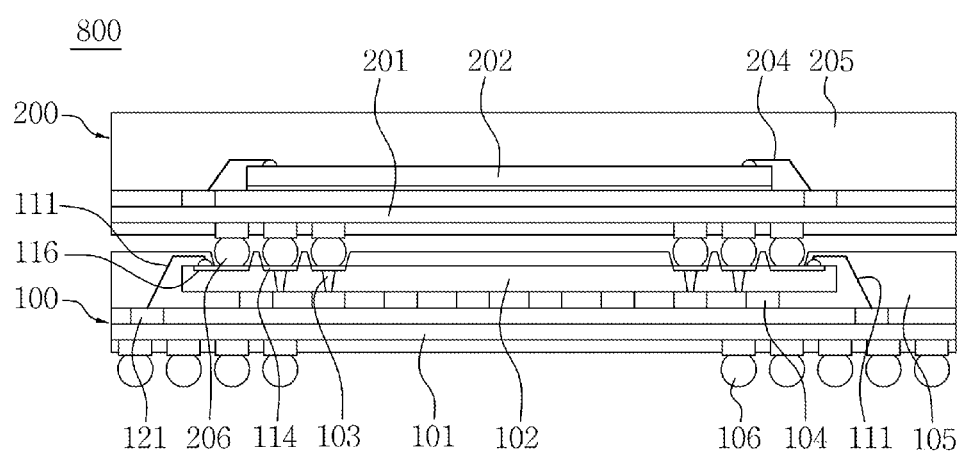
Figure 14:
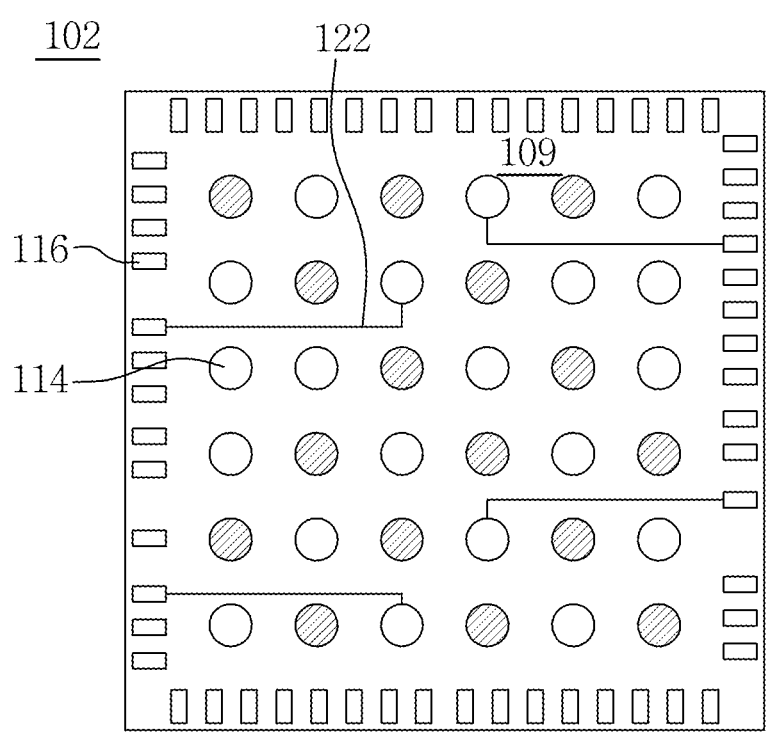
Figure 15:
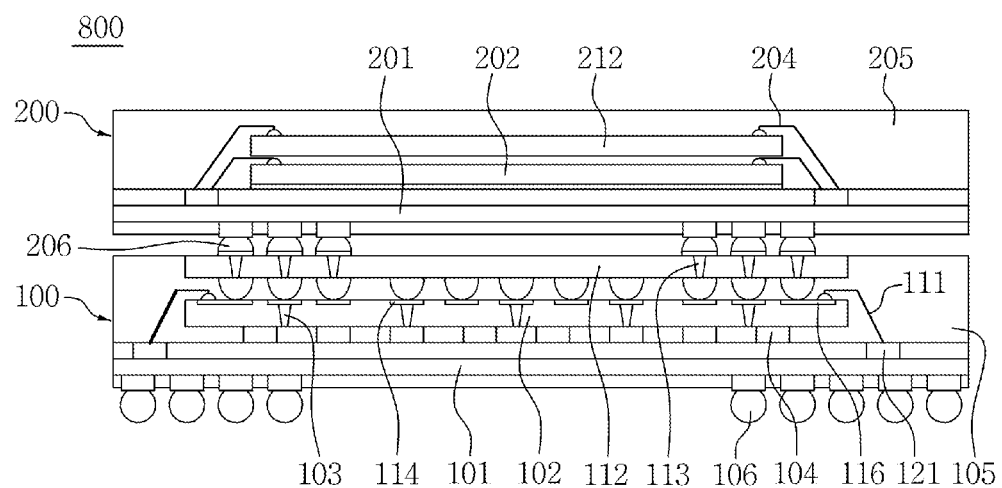

FIGS. 13 to 15 are cross-sectional views and a partial plan view of a semiconductor package according to example embodiments of the inventive concepts.

Referring to FIG. 13, in a stacked semiconductor package 800 according to example embodiments of the inventive concepts, the first semiconductor package 100 further includes a bonding wire 111 that electrically connects the first semiconductor device 102 to the first printed circuit board 101. The first printed circuit board 101 further includes a bond pad 116 on the second surface 109, and the bonding wire 111 that electrically connects the bond pad 116 to a bond finger 121 formed on the first printed circuit board 101. A part of signals transmitted to or from the second semiconductor package 200 may be transmitted to the first semiconductor package 100 through the bonding wire 111, and another part of the signals may be transmitted to the first semiconductor package 100 through the first through electrode 103.

Referring to FIG. 14, the first semiconductor device 102 may further include a second re-distribution layer 122 connecting the connection land 114 to the bond pad 116 on the second surface 109. The bond pad 116 may be formed at the outside of the second surface 109 to shorten the length of the bonding wire 111 such that electrical characteristics are enhanced and a defect in connection may be prevented. Here, the connection land 114 for the connection to the second semiconductor package 200 may be formed in the middle of the second surface, and signals may be transmitted from the connection land 114 to the bond pad 116 and the bonding wire 111 through the second re-distribution layer 122. For example, a signal required for driving the semiconductor device in common may be transmitted through the first through electrode 103, and a signal individually required for driving the second semiconductor devices 202 may be transmitted to the second semiconductor devices 202 through the bonding wire 111. The signal required in common may be a power or ground signal.

Referring to FIG. 15, when at least one first semiconductor device 102 and the third semiconductor device 112 are stacked on the first semiconductor package 100, the bonding wire 111 connecting the at least one first semiconductor device 102 to the first printed circuit board 101 may be formed. For example, the first semiconductor device 102 formed at a lower part may include the bond pad 116 at a surface facing the third semiconductor device 112 formed at an upper part. The bonding wire 111 may transmit a signal of the third semiconductor device 112 formed at the upper part, or a signal of the second semiconductor package 200 transmitted through the second through electrode 113 formed in the third semiconductor device 112. As another example, when the third semiconductor device 112 is stacked between the first semiconductor device 102 and the first printed circuit board 101, the third semiconductor device 112 may not include the second through electrode 113. In this case, the third semiconductor device 112 may include the bond pad 116 on a surface facing the first semiconductor device 102 formed at an upper part. The bonding wire 111 may be formed to connect the third semiconductor device 112 to the first printed circuit board 101, and may be electrically connected to the first through electrode 103 formed in the first semiconductor device 102.

Figure 16:
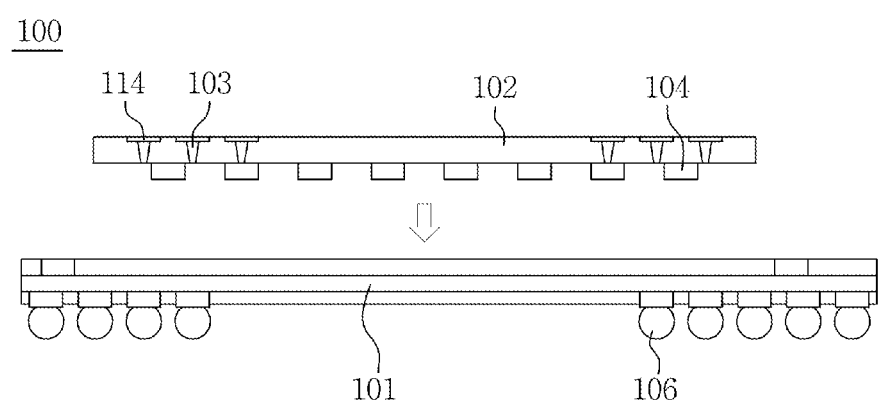
Figure 17:
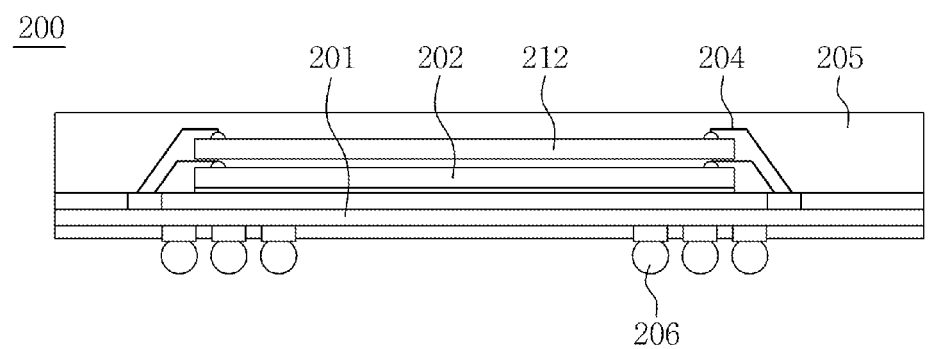
Figure 18:
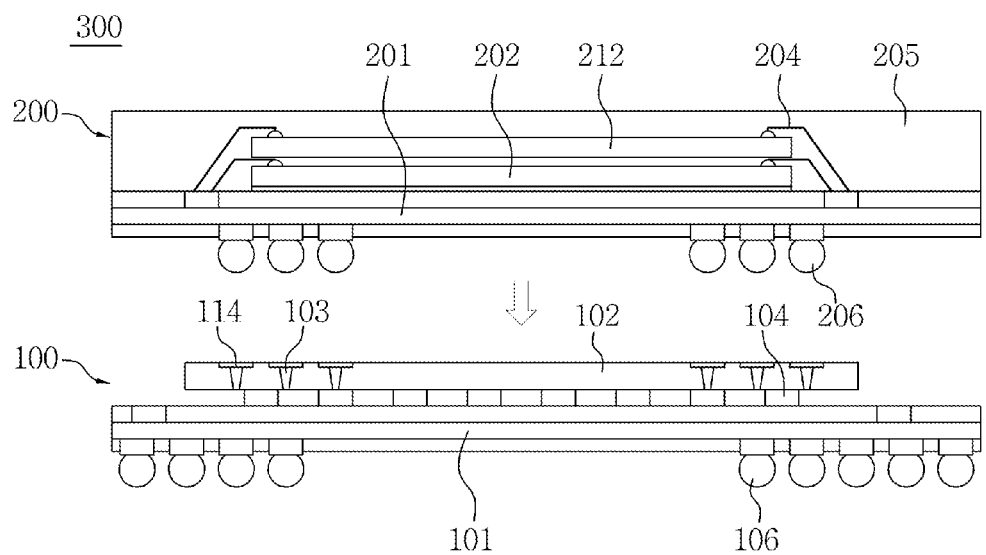

FIGS. 16 to 18 illustrate a method of fabricating a semiconductor package according to example embodiments of the inventive concepts.

Referring to FIG. 16, the first semiconductor package 100 is formed by mounting the first semiconductor device 102 on the first printed circuit board 101. The first semiconductor device 102 is formed by forming an integrated circuit (not shown) and the first through electrode 103 on a wafer and sawing the wafer into discrete devices. Before or after forming the integrated circuit, or while the integrated circuit is formed, the first through electrode 103 may be formed.

The first semiconductor device 102, which is fabricated as a result of the process, is electrically connected to the first printed circuit board 101. The first printed circuit board 101 may be a printed circuit board. The electrical connection may be made in a bonding or flip chip manner. When the connection is made in a wire bonding manner, the first semiconductor device 102 may be fixed to a surface of the first printed circuit board 101 using an adhesive (not shown), and a bonding pad (see element 116 of FIG. 15) formed on a surface of the first semiconductor device 102 may be connected to a bond finger (see element 121 of FIG. 15) formed on a surface on which the first semiconductor device 102 of the first printed circuit board 101 is mounted using a metal wire (not shown). A first molding structure (see element 105 of FIG. 15) surrounding the metal wire may be further formed to protect the metal wire. Even when the connection is made in a wire bonding manner, the first connection 104 electrically connected to the first through electrode 103 may be formed on a surface of the first semiconductor device 102 using the discrete device before sawing. The first connection 104 electrically connects the second semiconductor package 200 to the first printed circuit board 101. For example, the first connection 104 may be a solder bump, a solder ball or an ACF. When the connection is made in a flip chip manner, the first connection 104 electrically connected to the first through electrode 103 may be formed on a surface of the wafer using the discrete device before sawing. The first semiconductor device 102 and the second semiconductor package 200 are electrically connected to the first printed circuit board 101 through the first connection 104. The first connection 104 formed in the first semiconductor device 102 may be interposed between the first semiconductor device 102 and the first printed circuit board 101, and the first semiconductor device 102 may be physically/electrically connected to the first printed circuit board 101 through a reflow process. Then, the first molding structure 105 surrounding the first connection 104 may be further formed through an underfill process.

An integrated circuit formed in the first semiconductor device 102 may be mounted to face the first printed circuit board 101 or to face the opposite direction. When the first semiconductor device 102 is a chip scale package, it may be directly mounted on a module substrate (not shown), not on the first printed circuit board 101. The first semiconductor device 102 may be a logic chip.

The first external connection 106 of the first printed circuit board 101 may be formed before/after mounting the first semiconductor device 102. The first external connection 106 may be a solder bump, a solder ball, etc., and may be connected to a module substrate (not shown) in a similar manner to that of mounting the first semiconductor device 102 on the first printed circuit board 101.

Referring to FIG. 17, the second semiconductor package 200 is fabricated by mounting the second semiconductor devices 202 on the second printed circuit board 201. A method of fabricating the second semiconductor package 200 is similar to that of fabricating the first semiconductor package 100, and thus only differences will be described below.

With respect to the second semiconductor device 202, a plurality of second semiconductor devices 202 and 212 are connected to the second printed circuit board 201 through a second connection 204. The second connection 204 may be a through electrode (not shown) or a bonding wire, and the plurality of second semiconductor devices 202 and 212 may be stacked using it. The second semiconductor devices 202 and 212 may be the same type, or different types of semiconductor devices. At least one of the second semiconductor devices 202 and 212 may be a memory device.

Referring to FIG. 18, the first semiconductor package 100 and the second semiconductor package 200 are stacked to fabricate a stacked semiconductor package 300. The first semiconductor package 100 and the second semiconductor package 200 are respectively fabricated and tested, and only non-defective products are used. This enables efficient fabrication of the stacked package 300. The second external connection 206 of the second semiconductor package 200 is arranged on the connection land 114 formed in the first semiconductor device 102 or the first through silicon via (see element 107 of FIG. 9) to be stacked. As a result, the second semiconductor package 200 may be electrically connected to the first semiconductor package 100 to be stacked.

Figure 19:
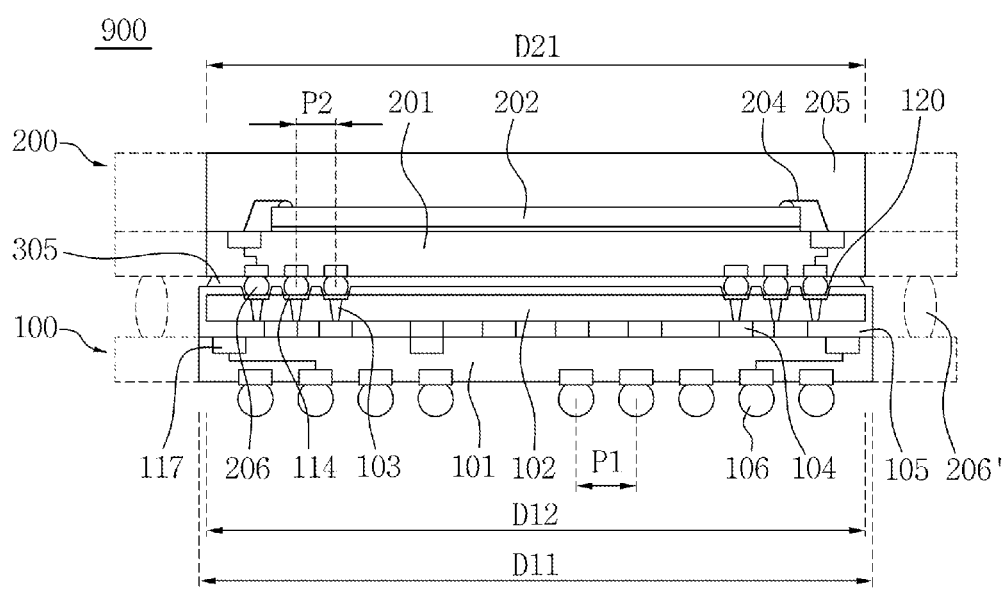

FIG. 19 is a cross-sectional view of a semiconductor package according to example embodiments of the inventive concepts.

Referring to FIG. 19, a semiconductor package 900 according to example embodiments of the inventive concepts includes a lower package 100, an upper package 200 attached to the lower package 100, and a plurality of conductive patterns 206 formed between the lower package 100 and the upper package 200. The lower package 100 has a lower substrate 101, a first semiconductor chip 102 mounted on the lower substrate 101, and a plurality of through electrodes 103 electrically connected to the lower substrate 101 through the first semiconductor chip 102. The conductive patterns 206 are connected to the through electrodes 103, and all of the conductive patterns 206 are arranged on the first semiconductor chip 102.

The lower package 100, the upper package 200 and the conductive patterns 206 may correspond to the first semiconductor package 100, the second semiconductor package 200 and the second external connection 206 described in FIGS. 1 to 18. The lower substrate 101, the first semiconductor chip 102 and the through electrodes 103 may correspond to the first printed circuit board 101, the first semiconductor device 102 and the first through electrode 103 described in FIGS. 1 to 18. Also, the lower package 100 may include a first connection 104, a first molding structure 105, a connection land 114 and internal interconnections 117. Openings 120 penetrating the first molding structure 105 may be provided on the through electrodes 103. The internal interconnections 117 may correspond to the interconnection patterns 117 described with reference to Embodiments 1 to 8.

In other example embodiments of the inventive concepts, the first molding structure 105 may be formed to expose a surface of the first semiconductor chip 102, and to fill a gap between the first semiconductor chip 102 and the lower substrate 101. In still other example embodiments of the inventive concepts, the first molding structure 105 may be omitted.

The lower substrate 101 may be formed of one selected from the group consisting of a rigid printed circuit board, a flexible printed circuit board and a combination thereof. For example, the lower substrate 101 may be a multi-layer printed circuit board in which prepreg (alternatively known as "pre-impregnated materials") and Cu foil are alternately and repeatedly stacked. The lower substrate 101 may include the internal interconnections 117 (e.g., a ball land, a bond finger, an interconnection for interlayer connection and a tab). Some of the internal interconnections 117 may be electrically connected to the through electrode 103 or the first semiconductor chip 102 through the first connection 104.

The upper package 200 may include an upper substrate 201, and a second semiconductor chip 202 mounted on the upper substrate 201. The upper substrate 201 and the second semiconductor chip 202 may correspond to the second printed circuit board 201 and the second semiconductor device 202 described in FIGS. 1 to 18. The upper substrate 201 may be formed of one selected from the group consisting of a rigid printed circuit board, a flexible printed circuit board and a combination thereof. The second semiconductor chip 202 may be electrically connected to the upper substrate 201 using a second connection 204. The second connection 204 may be formed of one selected from the group consisting of a bonding wire, a beam lead, a conductive tape and a combination thereof. Further, the upper package 200 may further include a second molding structure 205. Moreover, a third molding structure 305 may be provided in a gap between the lower package 100 and the upper package 200. The third molding structure 305 may cover the conductive patterns 206.

The conductive patterns 206 may be formed between the upper substrate 201 and the first semiconductor chip 102. The second semiconductor chip 202 may be electrically connected to the lower substrate 101 via the second connection 204, the upper substrate 201, the conductive patterns 206, the connection land 114, the through electrodes 103 and the first connection 104. The first semiconductor chip 102 may be electrically connected to the lower substrate 101 via the first connection 104. That is, the first semiconductor chip 102 and the second semiconductor chip 202 may be electrically connected to each other via the lower substrate 101 or the through electrodes 103. The conductive patterns 206 may be formed of one selected from the group consisting of a solder ball, a conductive bump, a conductive spacer, a PGA, an LGA, an ACF and a combination thereof.

A plurality of external terminals 106 may be formed on a surface of the lower substrate 101. The external terminals 106 may correspond to the first external connection 106 described in FIGS. 1 to 18. The external terminals 106 may be electrically connected to the internal interconnections 117. The external terminals 106 may be electrically connected to the first semiconductor chip 102 and the second semiconductor chip 202 via the internal interconnections 117, the first connection 104, the through electrodes 103, and the conductive patterns 206. The external terminals 106 may be formed of one selected from the group consisting of a solder ball, a conductive bump, a conductive spacer, a PGA, an LGA, an ACF and a combination thereof.

As described above, according to example embodiments of the inventive concepts, all of the conductive patterns 206 may be arranged on the first semiconductor chip 102. That is, a detour pattern 206' for connecting the upper package 200 to the lower package 100 and the external terminals 106 is not required. In general, when the detour pattern 206' is used, the lower substrate 101 should have an elongated size at an external side of the first semiconductor chip 102. Therefore, the semiconductor package 900 according to example embodiments of the inventive concepts has an advantageous structure in terms of compact size.

In some example embodiments of the inventive concepts, the lower substrate 101 may have a first width D11, the first semiconductor chip 102 may have a second width D12, and the upper substrate 201 may have a third width D21. When the first molding structure 105 is formed to surround the first semiconductor chip 102, the lower substrate 101 may have a greater width than the first semiconductor chip 102. In this case, the first width D11 may be smaller than a value in which 100 μm is added to the second width D12. In other example embodiments of the inventive concepts, the first width D11 may be the same as the second width D12. That is, the first width D11 of the lower substrate 101 may be substantially the same as the first semiconductor chip 102.

Furthermore, the third width D21 may be equal to, or greater than, the first width D11. That is, the third width D21 of the upper substrate 201 may have the same width as, or a greater width than, the lower substrate 101. In other example embodiments of the inventive concepts, the third width D21 may be equal to, or greater than, the second width D12. That is, the upper package 200 may have the same width as, or a greater width than, the first semiconductor chip 102.

In still other example embodiments of the inventive concepts, the third width D21 may be equal to, or smaller than, the first width D11. That is, the third width D21 of the upper substrate 201 may have the same width as, or a smaller width than, the lower substrate 101. In yet other example embodiments of the inventive concepts, the third width D21 may be equal to, or smaller than, the second width D12. That is, the upper package 200 may have the same width as, or a smaller width than, the first semiconductor chip 102.

The external terminals 106 may be arranged to have a first pitch P1, and the conductive patterns 206 may be arranged to have a second pitch P2 different from the first pitch P1. The conductive patterns 206 may be formed to have the size and interval corresponding to the through electrodes 103. The conductive patterns 206 may be smaller than the external terminals 106. The second pitch P2 may be smaller than the first pitch P1.

Figure 20:
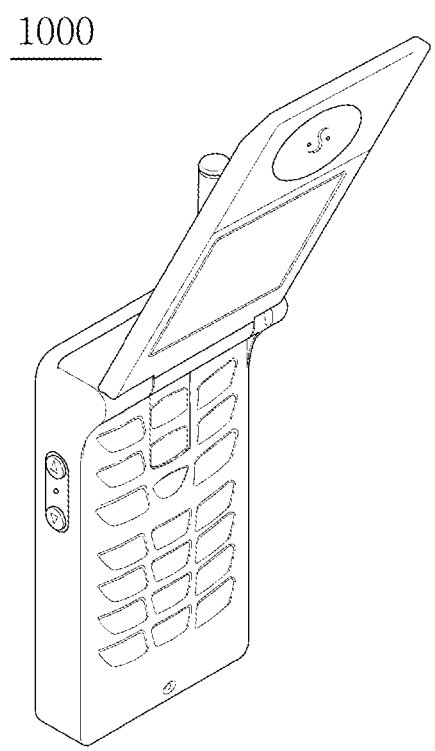

FIG. 20 is a perspective view of an electronic device including a semiconductor package according to example embodiments of the inventive concepts.

Referring to FIG. 20, a semiconductor package according to example embodiments of the inventive concepts may be applied to an electronic device 1000 (e.g., a cellular phone). The semiconductor package according to example embodiments of the inventive concepts is excellent in terms of compact size and performance improvement, and thus is advantageous for the light, thin, short and small electronic device 100 capable of simultaneously implementing various functions. The electronic device may not be limited to the cellular phone illustrated in FIG. 20, and may include various electronic devices (e.g., mobile electronic devices, laptop computers, portable computers, portable media players (PMP), MP3 players, camcorders, web tablets, wireless telephones, navigations, personal digital assistant (PDA), etc.).

Figure 21:
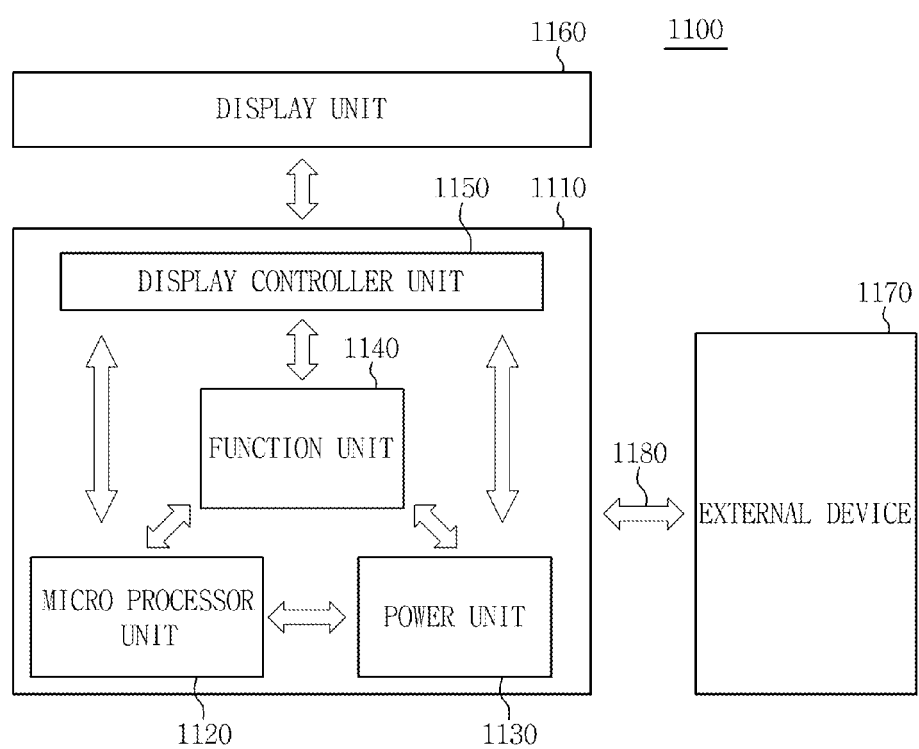

FIG. 21 is a system block diagram of an electronic device employing a semiconductor package according to example embodiments of the inventive concepts.

Referring to FIG. 21, the above-described semiconductor packages 100 to 900 may be applied to an electronic system 1100. The electronic system 1100 may include a body 1110, a micro processor unit 1120, a power unit 1130, a function unit 1140 and a display controller unit 1150. The body 1110 may includes a set board formed of a printed circuit board therein, and the micro processor unit 1120, the power unit 1130, the function unit 1140 and the display controller unit 1150 may be mounted on the body 1110. A display unit 1160 may be disposed in or on a surface of the body 1110. The display unit 1160 may display an image processed by the display controller unit 1150 disposed on the surface of the body 1110.

The power unit 1130 is supplied with a set voltage from an external battery (not shown), and divides the voltage into a required voltage level to supply to the micro processor unit 1120, the function unit 1140 and the display controller unit 1150. The micro processor unit 1120 receives a voltage from the power unit 1130 to control the function unit 1140 and the display unit 1160. The function unit 1140 may perform various functions. For example, when the electronic device 1000 is a cellular phone, the function unit 1140 may include various components capable of functioning as a cellular phone (e.g., dialing, outputting an image on the display unit 1160 as a result of communication with an external apparatus 1170, and outputting voice through a speaker), and when a camera is formed, the function unit 1140 may be a camera image processor. For example, when the electronic device 1000 is connected to a memory card for capacity expansion, the function unit 1140 may be a memory card controller. The function unit 1140 may transmit and receive a signal to/from the external apparatus 1170 through a wired or wireless communication unit 1180. For example, when the electronic device 1000 requires a universal serial bus (USB) for capacity expansion, the function unit 1140 may be an interface controller. The semiconductor packages 100 to 900 according to example embodiments of the inventive concepts may be used for at least one of the micro processor unit 1120 and the function unit 1140. The first external connection 106 of the first printed circuit board 101 may be connected to a bonding pad formed in the body 1110.

According to example embodiments of the inventive concepts, in a stacked package, upper and lower packages can be electrically connected in a semiconductor device region, so that the size of a package can be reduced, and high integration density can be implemented. Further, a gap between the upper and lower packages is not necessary, so that a micro pitch of the upper package can be implemented. Moreover, the upper and lower packages are electrically connected through a through electrode, so that electrical characteristics can be enhanced. Moreover, a non-defective package that is tested is selected to be stacked, so that the yield can be improved.

The inventive disclosure may be widely and usefully used in the field of the manufacturing industry manufacturing electronic products using semiconductor packages and communication industry as well as a semiconductor industry manufacturing a semiconductor package.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. It is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of fabricating a stacked semiconductor package, comprising:
    mounting at least one first semiconductor device on a first printed circuit board to form a first semiconductor package;
    mounting at least one second semiconductor device on a second printed circuit board to form a second semiconductor package;
    stacking the second semiconductor package on the first semiconductor package;
    forming a first through electrode that electrically connects the second semiconductor package to the first printed circuit board through the at least one first semiconductor device; and
    coupling the first through electrode of the at least one first semiconductor device to an external terminal of the second printed circuit board.

2. The method of claim 1, further comprising forming a first connection that electrically connects the first through electrode to the first printed circuit board,
    wherein mounting the at least one first semiconductor device includes positioning the at least one first semiconductor device between the second semiconductor package and the first printed circuit board.

3. The method of claim 1, further comprising partially covering the at least one first semiconductor device and the first printed circuit board with a first molding structure, and
    forming at least one first conductive pattern that electrically connects the second semiconductor package to the first printed circuit board through the first molding structure.

4. The method of claim 1, further comprising forming at least one second external connection electrically connected to the first through electrode on a surface of the second semiconductor package facing the first semiconductor package.

5. The method of claim 4, further comprising forming a second molding structure interposed between the first semiconductor package and the second semiconductor package so as to cover the second external connection.

6. The method of claim 1, further comprising forming a re-distribution layer (RDL) on a first surface of the at least one first semiconductor device facing the first printed circuit board or a second surface of the at least one first semiconductor device facing the second semiconductor package.

7. The method of claim 6, further comprising forming at least one connection land and a bond pad on the second surface, wherein the RDL is formed on the second surface and connects the at least one connection land to the bond pad; and
forming a bonding wire electrically connecting the bond pad to the first printed circuit board.

8. The method of claim 1, further comprising forming at least one connection pad and a RDL on a first surface of the at least one first semiconductor device, wherein the RDL connects the first through electrode to the at least one connection pad.

9. The method of claim 1, further comprising stacking at least one third semiconductor device on the first semiconductor device; and
forming at least one second through electrode that electrically connects the second semiconductor package to the at least one first semiconductor device through the at least one third semiconductor device.

10. A method of fabricating a semiconductor package, comprising:
forming a lower package including a lower substrate, at least one first semiconductor chip mounted on the lower substrate, and a plurality of first through electrodes electrically connected to the lower substrate through the at least one first semiconductor chip;
attaching an upper substrate to the lower package;
mounting a second semiconductor chip on the upper substrate;
forming a plurality of conductive patterns between the lower package and the upper substrate such that all of the plurality of conductive patterns are positioned on the at least one first semiconductor chip, wherein the plurality of conductive patterns are connected to the plurality of first through electrodes; and
coupling at least one of the plurality first through electrodes of the lower substrate to an external terminal of the second semiconductor chip.

11. The method of claim 10, wherein a width of the lower substrate is formed smaller than 100 µm more than a width of the at least one first semiconductor chip.

12. The method of claim 10, wherein the width of the lower substrate is formed substantially the same as that of the at least one first semiconductor chip.

13. The method of claim 10, wherein the plurality of conductive patterns are formed of one selected from the group consisting of a solder ball, a conductive bump, a conductive spacer, a pin grid array (PGA), a lead grid array (LGA), an adhesive conductive film (ACF) and a combination thereof.

14. The method of claim 10, further comprising forming a plurality of external terminals on a surface of the lower substrate,
wherein the plurality of external terminals have a first pitch, and the plurality of conductive patterns have a second pitch different from the first pitch.

15. The method of claim 14, wherein the second pitch is smaller than the first pitch.

16. The method of claim 14, wherein the plurality of external terminals are formed of one selected from the group consisting of a solder ball, a conductive bump, a conductive spacer, a PGA, an LGA, an ACF and a combination thereof.

17. A method of fabricating a semiconductor package, comprising:
forming a lower package including a lower substrate, at least one first semiconductor chip adjacent to the lower substrate, a plurality of through electrodes penetrating the at least one first semiconductor chip, and an interposer adjacent to the first semiconductor chip;
attaching an upper substrate to the lower package;
mounting a second semiconductor chip on the upper substrate; and
forming a plurality of conductive patterns between the lower package and the upper substrate; and
coupling at least one of the plurality first through electrodes of the lower substrate to an external terminal of the second semiconductor chip,
wherein the interposer includes a plurality of front pads on a first surface, and a plurality of back pads formed on a second surface facing the first surface and electrically connected to the front pads.

18. The method of claim 17, wherein the interposer is formed between the at least one first semiconductor chip and the lower substrate,
the plurality of front pads have a first pitch corresponding to the plurality of through electrodes, and
the plurality of back pads have a second pitch different from the first pitch.

19. The method of claim 17, wherein the interposer is formed between the at least one first semiconductor chip and the upper substrate,
the plurality of front pads have a first pitch corresponding to the plurality of conductive patterns, and
the plurality of back pads have a second pitch corresponding to the plurality of through electrodes.

* * * * *